United States Patent
Lee et al.

(10) Patent No.: US 9,601,172 B2
(45) Date of Patent: Mar. 21, 2017

(54) ADDRESS ALIGNER AND MEMORY DEVICE INCLUDING THE SAME

(71) Applicant: SAMSUNG ELECTRONICS CO., LTD., Suwon-si, Gyeonggi-Do (KR)

(72) Inventors: Chang-Yong Lee, Hwaseong-si (KR); Gong-Heum Han, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 91 days.

(21) Appl. No.: 14/668,232

(22) Filed: Mar. 25, 2015

(65) Prior Publication Data

US 2016/0064057 A1    Mar. 3, 2016

(30) Foreign Application Priority Data

Sep. 1, 2014 (KR) .................. 10-2014-0115178

(51) Int. Cl.
*G11C 8/00* (2006.01)
*G11C 8/18* (2006.01)
*G11C 8/06* (2006.01)

(52) U.S. Cl.
CPC . *G11C 8/18* (2013.01); *G11C 8/06* (2013.01)

(58) Field of Classification Search
CPC .................................. G11C 8/18; G11C 8/06
USPC ............... 365/230.08, 230.09, 233.1, 230.04
See application file for complete search history.

(56) References Cited

U.S. PATENT DOCUMENTS

| | | | |
|---|---|---|---|
| 5,912,858 A * | 6/1999 | Tomita | G11C 7/1072 365/189.07 |
| 6,163,498 A | 12/2000 | Moon | |
| 6,317,377 B1 | 11/2001 | Kobayashi | |
| 6,839,291 B2 * | 1/2005 | Shin | G11C 7/22 365/194 |
| 6,944,069 B2 * | 9/2005 | Kim | G11C 7/1048 365/191 |
| 6,968,025 B2 | 11/2005 | Tamahashi | |
| 7,073,014 B1 | 7/2006 | Roohparvar | |
| 7,420,869 B2 | 9/2008 | Lindorfer et al. | |

(Continued)

FOREIGN PATENT DOCUMENTS

| | | |
|---|---|---|
| KR | 0311038 B | 9/2001 |
| KR | 0660892 B1 | 12/2006 |
| KR | 0915824 B | 8/2009 |

*Primary Examiner* — Viet Q Nguyen
(74) *Attorney, Agent, or Firm* — Volentine & Whitt, PLLC

(57) ABSTRACT

An address aligner includes a command address providing unit, an alignment signal providing unit and an alignment unit. The command address providing unit outputs a sync command address signal by delaying a command address signal in synchronization with a first clock signal. The sync command address signal is synchronized with the first clock signal. The alignment signal providing unit outputs alignment clock signals by delaying a chip select signal in synchronization with a second clock signal. The alignment clock signals are synchronized with the second clock signal. The alignment unit outputs a plurality of addresses in synchronization with the alignment clock signals. The plurality of addresses is included in the sync command address signal. If the address aligner according to example embodiments is used, the operation speed of the memory device may be increased by aligning a plurality of addresses in synchronization with the alignment clock signal that is generated based on a chip select signal.

18 Claims, 17 Drawing Sheets

(56) References Cited

U.S. PATENT DOCUMENTS

| | | | |
|---|---|---|---|
| 8,553,469 B2 * | 10/2013 | Berke | G06F 13/1673 365/189.02 |
| 8,755,247 B2 | 6/2014 | Ba et al. | |
| 8,930,597 B1 * | 1/2015 | Fung | G06F 13/1689 370/537 |
| 2006/0285424 A1 * | 12/2006 | Gregorius | G06F 13/4243 365/233.1 |
| 2007/0121418 A1 | 5/2007 | Kim et al. | |
| 2007/0283297 A1 * | 12/2007 | Hein | G11C 7/22 716/100 |
| 2008/0159023 A1 * | 7/2008 | Park | G11C 7/1027 365/194 |
| 2009/0168546 A1 * | 7/2009 | Kim | G11C 7/1051 365/189.05 |
| 2009/0175091 A1 | 7/2009 | Lee | |
| 2010/0054059 A1 * | 3/2010 | Yoon | G11C 7/1072 365/194 |
| 2011/0050295 A1 * | 3/2011 | Kim | G06F 1/06 327/115 |
| 2012/0117338 A1 * | 5/2012 | Vaidyanath | G06F 13/1689 711/154 |
| 2012/0250433 A1 * | 10/2012 | Jeon | G11C 8/18 365/193 |
| 2012/0260137 A1 * | 10/2012 | Berke | G06F 13/1673 714/721 |
| 2013/0250712 A1 * | 9/2013 | Byun | G11C 8/18 365/230.03 |
| 2014/0189224 A1 * | 7/2014 | Kostinsky | G11C 7/1063 711/105 |
| 2015/0221355 A1 * | 8/2015 | Vo | G11C 8/18 365/194 |

* cited by examiner

ADDRESS ALIGNER AND MEMORY DEVICE INCLUDING THE SAME

CROSS-REFERENCE TO RELATED APPLICATION

This application claims priority under 35 USC §119 to Korean Patent Applications No. 10-2014-0115178, filed on Sep. 1, 2014 in the Korean Intellectual Property Office (KIPO), the contents of which are herein incorporated by reference in their entirety.

BACKGROUND

1. Technical Field

Example embodiments relate generally to a semiconductor device and more particularly to an address aligner and a memory device including the address aligner.

2. Description of the Related Art

A volatile memory loses its stored data when a power supply is cut off. Examples of volatile memories include DRAM, SRAM, and so forth.

According to development of technology related to an electronic device, memory devices are being developed to have higher performance. For higher performance, various research is in progress.

SUMMARY

Some example embodiments of the present inventive concept provide an address aligner capable of increasing performance by aligning a plurality of addresses included in a command address signal based on a clock signal and a chip select signal.

Some example embodiments provide a memory device capable of increasing performance by aligning the plurality of addresses included in the command address signal based on the clock signal and the chip select signal.

According to example embodiments, an address aligner includes a command address providing unit, an alignment signal providing unit and an alignment unit. The command address providing unit outputs a sync command address signal by delaying a command address signal in synchronization with a first clock signal. The sync command address signal is synchronized with the first clock signal. The alignment signal providing unit outputs alignment clock signals by delaying a chip select signal in synchronization with a second clock signal. The alignment clock signals are synchronized with the second clock signal. The alignment unit outputs a plurality of addresses in synchronization with the alignment clock signals. The plurality of addresses are included in the sync command address signal.

The command address providing unit may include a command address latch. The command address signal may be provided to an input node of the command address latch. The first clock signal may be provided to a clock node of the command address latch. The sync command address signal may be outputted in synchronization with the first clock signal through an output node of the command address latch.

The alignment signal providing unit may include a chip select latch. The chip select signal may be provided to an input node of the chip select latch. The second clock signal may be provided to a clock node of the chip select latch. A first alignment clock signal of the alignment clock signals may be outputted through an output node of the chip select latch. A second alignment clock signal of the alignment clock signals may be outputted through an inversion output node of the chip select latch.

The first alignment clock signal and the second alignment clock signal may be provided in synchronization with the second clock signal. The first clock signal may be equal to the second clock signal.

The alignment unit may include a first alignment unit and a second alignment unit. The first alignment unit may output an odd number address included in the sync command address signal in synchronization with a first alignment clock signal and a second alignment clock signal among the alignment clock signal. The second alignment unit may output an even number address included in the sync command address signal in synchronization with the second alignment clock signal among the alignment clock signal.

The first alignment unit may include a first latch, a second latch and a third latch that are cascade-connected. The first alignment clock signal may be applied to a clock node of the first latch. The second alignment clock signal may be applied to a clock node of the second latch and the third latch.

The sync command address signal may be provided to an input node of the first latch. A first address included in the sync command address signal may be outputted from an output node of the third latch. A third address included in the sync command address signal may be outputted from an output node of the second latch.

The second alignment unit may include a fourth latch and a fifth latch that are cascade-connected. The second alignment clock signal may be applied to a clock node of the fourth latch and the fifth latch.

The sync command address signal may be provided to an input node of the fourth latch. A second address included in the sync command address signal may be outputted from an output node of the fifth latch. A fourth address included in the sync command address signal may be outputted from an output node of the fourth latch.

The plurality of addresses may be row addresses of a memory device. The plurality of addresses may be column addresses of a memory device.

According to example embodiments, an address aligner includes a command address providing unit, an alignment signal providing unit and an alignment unit. The command address providing unit outputs an odd command address signal and an even command address signal by delaying a command address signal in synchronization with a divided clock signal. The odd command address signal and the even command address signal are synchronized with the divided clock signal that is generated by dividing a clock signal. The alignment signal providing unit outputs an odd alignment signal and an even alignment signal by delaying a chip select signal in synchronization with the divided clock signal. The odd alignment signal and the even alignment signal are synchronized with the divided clock signal. The alignment unit outputs a plurality of addresses included in the odd command address signal and the even command address signal based on the odd alignment signal, the even alignment signal and divided clock signal.

The alignment signal providing unit may provide a first alignment clock signal and a second alignment clock signal based on the chip select signal and the clock signal.

The address aligner according to example embodiments may increase performance by aligning a plurality of addresses included in a command address signal based on a clock signal and a chip select signal.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
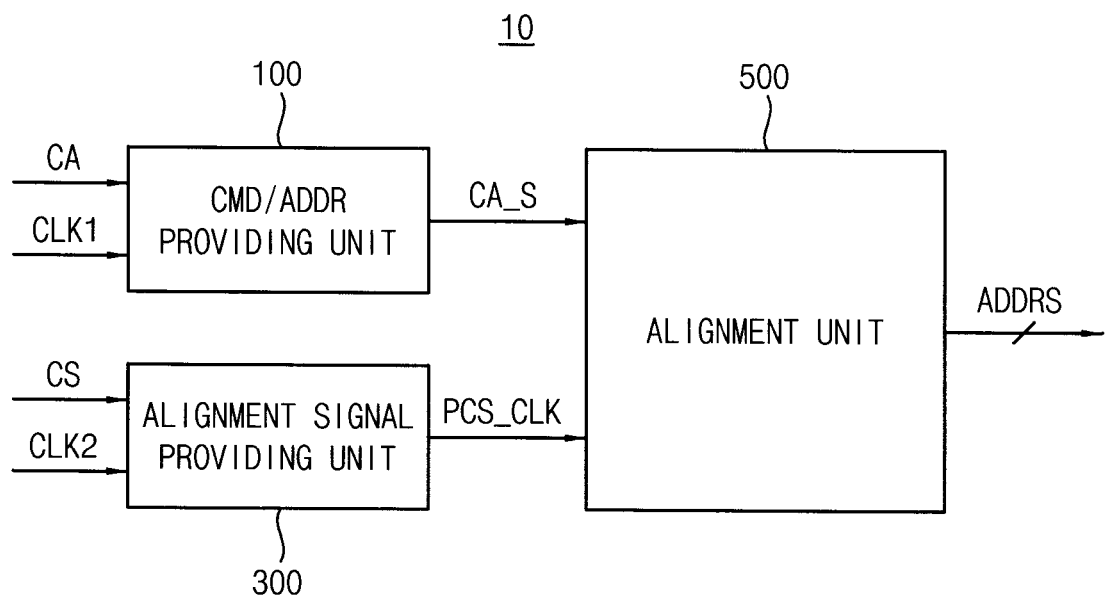
FIG. 1 is a block diagram illustrating an address aligner according to example embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating an address aligner according to example embodiments. Referring to FIG. 1, an address aligner 10 includes a command address providing unit 100, an alignment signal providing unit 300 and an alignment unit 500. The command address providing unit 100 outputs a sync command address signal CA_S by delaying a command address signal CA in synchronization with a first clock signal CLK1.

The sync command address signal CA_S is synchronized with the first clock signal CLK1. For example, the command address signal CA and the first clock signal CLK1 may be inputted to the command address providing unit 100. The sync command address signal CA_S outputted from the command address providing unit 100 may be a signal that is generated by delaying the command address signal CA in synchronization with the first clock signal CLK1. The sync command address signal CA_S may be a signal that is synchronized with the first clock signal CLK1.

The alignment signal providing unit 300 outputs alignment clock signals PCS_CLK by delaying a chip select signal CS in synchronization with a second clock signal CLK2. The alignment clock signals PCS_CLK are synchronized with the second clock signal CLK2. For example, the chip select signal CS and the second clock signal CLK2 may be inputted to the alignment signal providing unit 300. The alignment clock signals PCS_CLK outputted from the alignment signal providing unit 300 may be a signal that is generated by delaying the chip select signal CS in synchronization with the second clock signal CLK2. The alignment clock signals PCS_CLK may be a signal that is synchronized with the second clock signal CLK2.

The alignment unit 500 outputs a plurality of addresses ADDRS in synchronization with the alignment clock signals PCS_CLK. The plurality of addresses ADDRS are included in the sync command address signal CA_S. The plurality of addresses ADDRS may be more than two addresses. For example, the sync command address signal CA_S and the alignment clock signals PCS_CLK may be inputted to the alignment unit 500. The plurality of addresses ADDRS outputted from the alignment unit 500 may be a signal that is generated in synchronization with the alignment clock signal PCS_CLK.

For example, the first clock signal CLK1 may be equal to the second clock signal CLK2. The sync command address signal CA_S outputted from the command address providing unit 100 may be the signal that is synchronized with the first clock signal CLK1. The alignment clock signals PCS_CLK outputted from the alignment signal providing unit 300 may be the signal that is synchronized with the first clock signal CLK1. The plurality of addresses ADDRS outputted from the alignment unit 500 may be the signal that is generated in synchronization with the first clock signal CLK1.

If the address aligner 10 according to example embodiments is used, the operation speed of the memory device may be increased by aligning a plurality of addresses ADDRS in synchronization with the alignment clock signal PCS_CLK that is generated based on a chip select signal CS.

Figure 2:
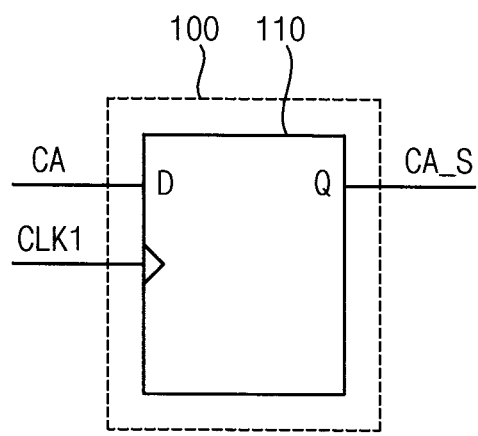
FIG. 2 is a diagram illustrating an example of a command address providing unit included in the address aligner of FIG. 1.
Figure 3:
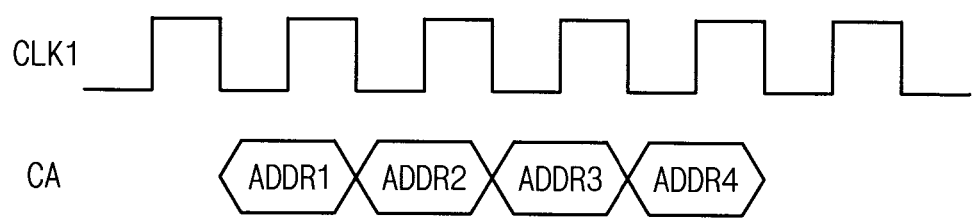
FIG. 3 is a timing diagram for describing an operation of the command address providing unit of FIG. 2.

FIG. 2 is a diagram illustrating an example of a command address providing unit included in the address aligner of FIG. 1, and FIG. 3 is a timing diagram for describing an operation of the command address providing unit of FIG. 2.

Referring to FIGS. 2 and 3, the command address providing unit 100 may include a command address latch 110. The command address signal CA may be provided to an input node of the command address latch 110. The first clock signal CLK1 may be provided to a clock node of the command address latch 110. The sync command address signal CA_S may be outputted in synchronization with the first clock signal CLK1 through an output node of the command address latch 110. For example, the command address signal CA may include a first address ADDR1, a second address ADDR2, a third address ADDR3 and a fourth address ADDR4. The first address ADDR1, the second address ADDR2, the third address ADDR3 and the fourth address ADDR4 may be sequentially inputted to the command address latch 110. If the first address ADDR1, the second address ADDR2, the third address ADDR3 and the fourth address ADDR4 are sequentially inputted to the command address latch 110, the command address latch 110 may output the sync command address signal CA_S in synchronization with the first clock signal CLK1. The sync command address signal CA_S may include the first address ADDR1, the second address ADDR2, the third address ADDR3 and the fourth address ADDR4 that are synchronized with the first clock signal CLK1.

Figure 4:
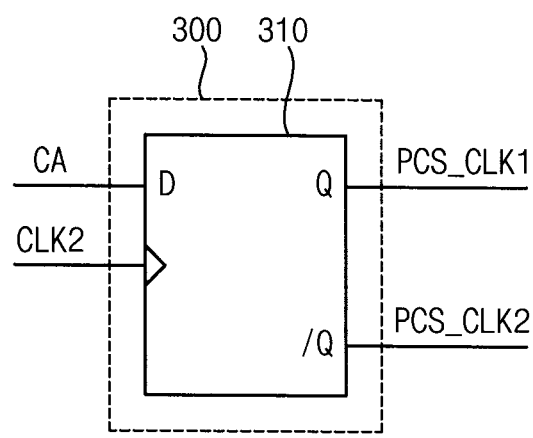
FIG. 4 is a diagram illustrating an example of an alignment signal providing unit included in the address aligner of FIG. 1.
Figure 5:
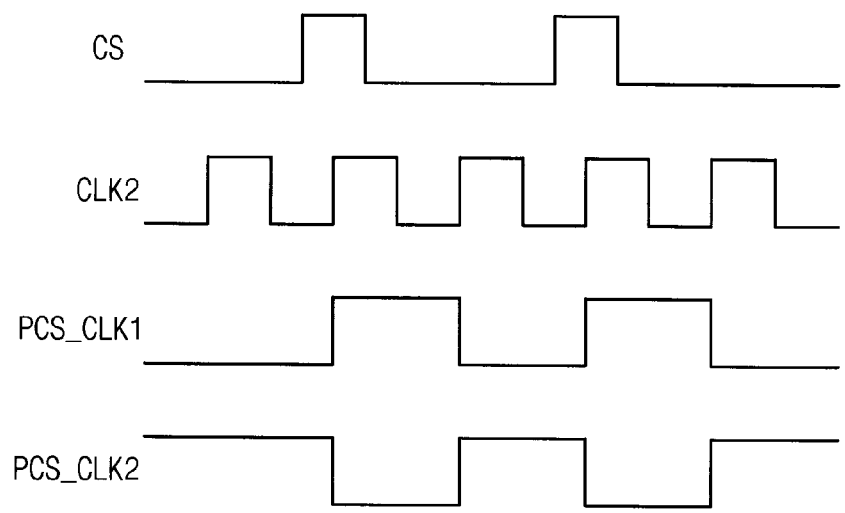
FIG. 5 is a timing diagram for describing an operation of the alignment signal providing unit of FIG. 4.

FIG. 4 is a diagram illustrating an example of an alignment signal providing unit included in the address aligner of FIG. 1, and FIG. 5 is a timing diagram for describing an operation of the alignment signal providing unit of FIG. 4.

Referring to FIGS. 4 and 5, the alignment signal providing unit 300 may include a chip select latch 310. The chip select signal CS may be provided to an input node of the chip select latch 310. The second clock signal CLK2 may be provided to a clock node of the chip select latch 310. A first alignment clock signal PCS_CLK1 of the alignment clock signals PCS_CLK may be outputted through an output node of the chip select latch 310. For example, the chip select signal CS and the second clock signal CLK2 may be inputted to the alignment signal providing unit 300. The alignment clock signals PCS_CLK outputted from the alignment signal providing unit 300 may be signals that are generated by delaying the chip select signal CS in synchronization with the second clock signal CLK2. The alignment clock signals PCS_CLK may be signals that are synchronized with the second clock signal CLK2.

The alignment clock signals PCS_CLK may include the first alignment clock signal PCS_CLK1 and the second alignment clock signal PCS_CLK2. The second alignment clock signal PCS_CLK2 may be an inversion signal of the first alignment clock signal PCS_CLK1. For example, the first alignment clock signal PCS_CLK1 may be outputted from the output node of the chip select latch 310. The second alignment clock signal PCS_CLK2 may be outputted from the inversion output node of the chip select latch 310.

In an example embodiment, a second alignment clock signal PCS_CLK2 of the alignment clock signals PCS_CLK may be outputted through an inversion output node of the chip select latch 310. In an example embodiment, the first alignment clock signal PCS_CLK1 and the second alignment clock signal PCS_CLK2 may be provided in synchronization with the second clock signal CLK2.

If the address aligner 10 according to example embodiments is used, the operation speed of the memory device may be increased by aligning a plurality of addresses ADDRS in synchronization with the alignment clock signal PCS_CLK that is generated based on a chip select signal CS.

Figure 6:
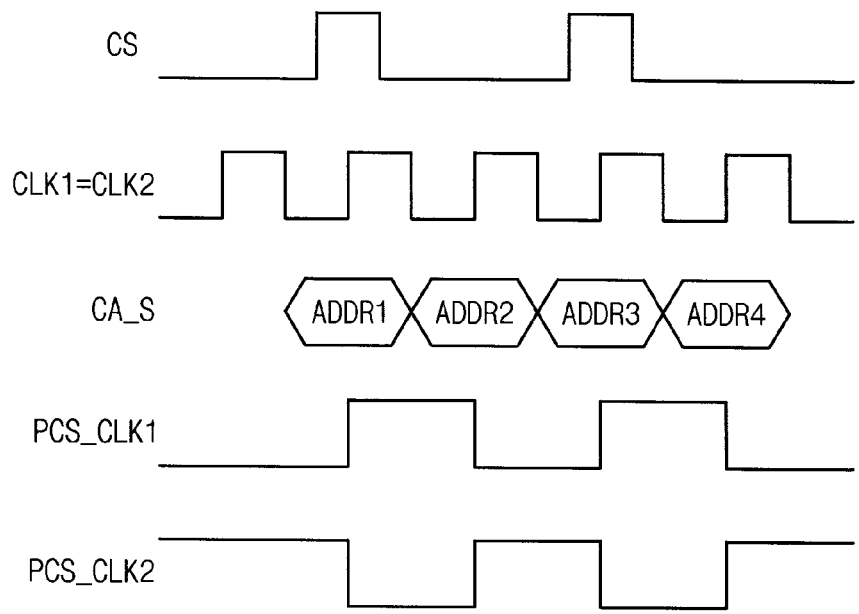
FIG. 6 is a timing diagram for describing a case where a first clock signal and a second clock signal that are provided to the address aligner of FIG. 1 are equal.

FIG. 6 is a timing diagram for describing a case where a first clock signal and a second clock signal CLK2 that are provided to the address aligner of FIG. 1 are equal.

Referring to FIG. 6, the first clock signal CLK1 may be equal to the second clock signal CLK2. For example, the command address signal CA may include a first address ADDR1, a second address ADDR2, a third address ADDR3 and a fourth address ADDR4. The first address ADDR1, the second address ADDR2, the third address ADDR3 and the fourth address ADDR4 may be sequentially inputted to the command address latch 110. If the first address ADDR1, the second address ADDR2, the third address ADDR3 and the fourth address ADDR4 are sequentially inputted to the command address latch 110, the command address latch 110 may output the sync command address signal CA_S in synchronization with the first clock signal CLK1. The sync command address signal CA_S may include the first address ADDR1, the second address ADDR2, the third address ADDR3 and the fourth address ADDR4 that are synchronized with the first clock signal CLK1. For example, the chip select signal CS and the first clock signal CLK1 may be inputted to the alignment signal providing unit 300. The alignment clock signals PCS_CLK outputted from the alignment signal providing unit 300 may be a signal that is generated by delaying the chip select signal CS in synchronization with the first clock signal CLK1. The alignment clock signals PCS_CLK may be signals that are synchronized with the first clock signal CLK1. The alignment clock signals PCS_CLK may include the first alignment clock signal PCS_CLK1 and the second alignment clock signal PCS_CLK2. The second alignment clock signal PCS_CLK2 may be an inversion signal of the first alignment clock signal PCS_CLK1. Therefore the sync command address signal CA_S outputted from the command address providing unit 100 may be the signal that is synchronized with the first clock signal CLK1. The alignment clock signals PCS_CLK outputted from the alignment signal providing unit 300 may be the signal that is synchronized with the first clock signal CLK1.

If the address aligner 10 according to example embodiments is used, the operation speed of the memory device may be increased by aligning a plurality of addresses ADDRS in synchronization with the alignment clock signal that is generated based on a chip select signal CS.

Figure 7:
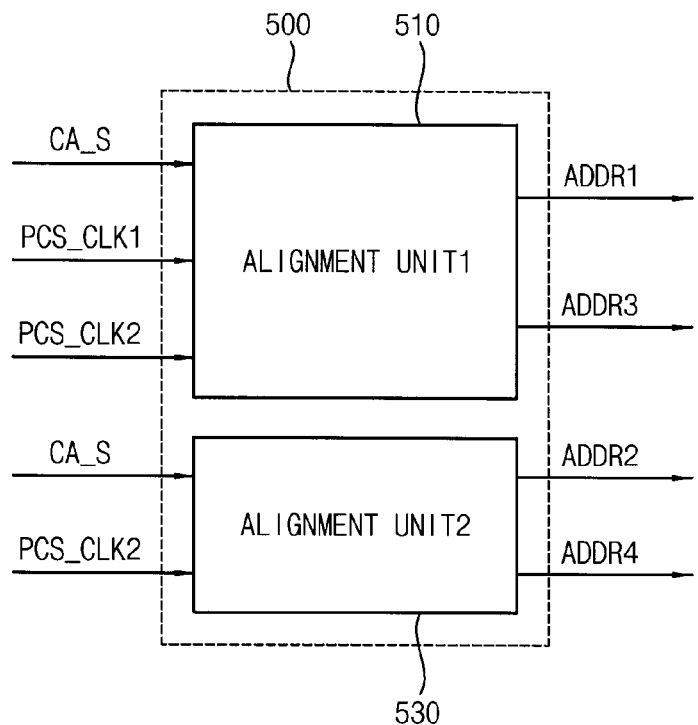
FIG. 7 is a block diagram illustrating an example of an alignment unit included in the address aligner of FIG. 1.

FIG. 7 is a block diagram illustrating an example of an alignment unit included in the address aligner of FIG. 1.

Referring to FIG. 7, the alignment unit 500 may include a first alignment unit 510 and a second alignment unit 530. The first alignment unit 510 may output an odd number address included in the sync command address signal CA_S in synchronization with a first alignment clock signal PCS_CLK1 and a second alignment clock signal PCS_CLK2 among the alignment clock signal PCS_CLK. For example, the first alignment unit 510 may output the first address ADDR1 and the third address ADDR3 included in the sync command address signal CA_S in synchronization with the first alignment clock signal PCS_CLK1 and the second alignment clock signal PCS_CLK2 among the alignment clock signal.

The second alignment unit 530 may output an even number address included in the sync command address signal CA_S in synchronization with the second alignment clock signal PCS_CLK2 among the alignment clock signal. For example, the second alignment unit 530 may output the second address ADDR2 and the fourth address ADDR4 included in the sync command address signal CA_S in synchronization with the second alignment clock signal PCS_CLK2 among the alignment clock signal.

Figure 8:
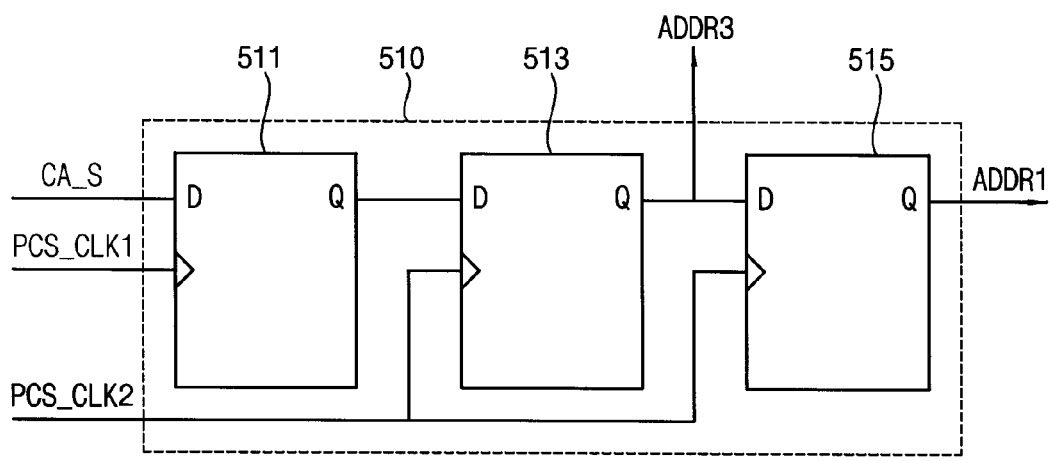
FIG. 8 is a diagram illustrating an example of a first alignment unit included in the alignment unit of FIG. 7.
Figure 9:
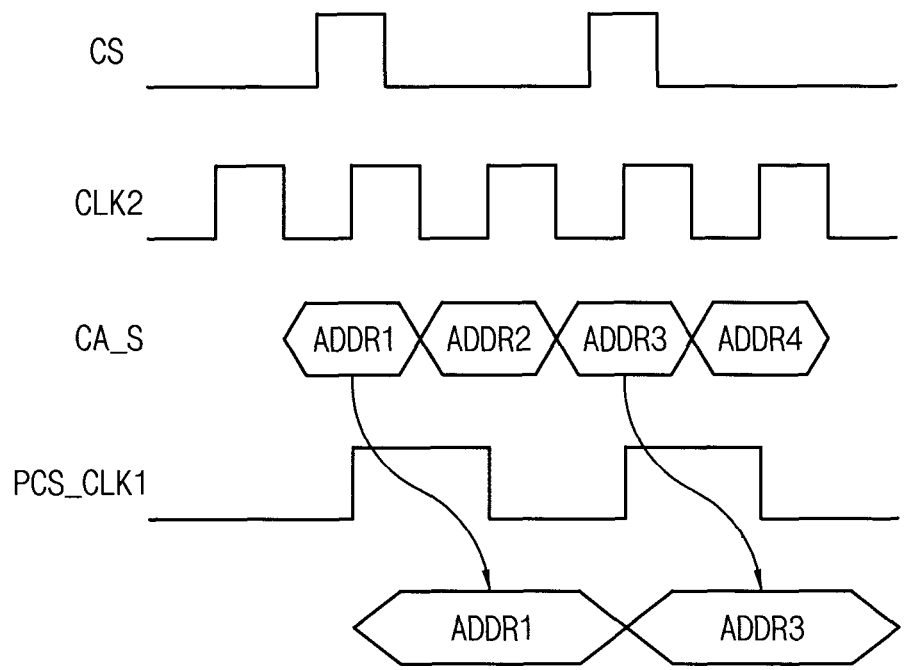
FIG. 9 is a timing diagram for describing an operation of the first alignment unit of FIG. 8.

FIG. 8 is a diagram illustrating an example of a first alignment unit included in the alignment unit of FIG. 7, and FIG. 9 is a timing diagram for describing an operation of the first alignment unit of FIG. 8.

Referring to FIGS. 8 and 9, the first alignment unit 510 may include a first latch 511, a second latch 513 and a third latch 515 that are cascade-connected. For example, the sync command address signal CA_S may be applied to an input node of the first latch 511. The first alignment clock signal PCS_CLK1 may be applied to a clock node of the first latch 511. The odd number addresses of the plurality of addresses ADDRS that are synchronized with the first alignment clock signal PCS_CLK1 may be outputted from the output node of the first latch 511.

For example, the sync command address signal CA_S may include the plurality of addresses ADDRS. The sync command address signal CA_S may include a first address ADDR1, a second address ADDR2, a third address ADDR3 and a fourth address ADDR4. The first address ADDR1, the second address ADDR2, the third address ADDR3 and the fourth address ADDR4 may be the plurality of addresses ADDRS. In this case, in a first rising edge of the first alignment clock signal PCS_CLK1, the first address ADDR1 may be outputted from the output node of the first latch 511 in synchronization with the first alignment clock signal PCS_CLK1. Next, in a second rising edge of the first alignment clock signal PCS_CLK1, the third address ADDR3 may be outputted from the output node of the first latch 511 in synchronization with the first alignment clock signal PCS_CLK1.

For example, the odd number addresses among the plurality of addresses ADDRS may be inputted to the input node of the second latch 513. The odd number addresses may be the output of the first latch 511. The second alignment clock signal PCS_CLK2 may be applied to a clock node of the second latch 513. The second alignment clock signal PCS_CLK2 may be an inversion signal of the first alignment clock signal PCS_CLK1. The odd number addresses of the plurality of addresses ADDRS that are synchronized with the second alignment clock signal PCS_CLK2 may be outputted from the output node of the second latch 513. The second alignment clock signal PCS_CLK2 may be inputted to a clock node of the second latch 513 so that the plurality of addresses ADDRS that are outputted from the first alignment unit 510 and the second alignment unit 530 are aligned in the second alignment clock signal PCS_CLK2.

For example, the odd number addresses among the plurality of addresses ADDRS may be inputted to the input node of the third latch 515. The odd number addresses may be the output of the second latch 513. The second alignment clock signal PCS_CLK2 may be applied to a clock node of the third latch 515. In case the first address ADDR1 is outputted from the output node of the third latch 515 in synchronization with the second alignment clock signal PCS_CLK2, the third address ADDR3 may be outputted from the output node of the second latch 513 in synchronization with the second alignment clock signal PCS_CLK2. In this case, the first address ADDR1 and the third address ADDR3 that are outputted from the first alignment unit 510 may be aligned in synchronization with the second alignment clock signal PCS_CLK2. The first alignment unit 510 may output the odd number addresses of the plurality of addresses ADDRS.

In an example embodiment, the second alignment clock signal PCS_CLK2 may be applied to a clock node of the second latch 513 and the third latch 515.

In an example embodiment, the sync command address signal CA_S may be provided to an input node of the first latch 511. A first address ADDR1 included in the sync command address signal CA_S may be outputted from an output node of the third latch 515. A third address ADDR3 included in the sync command address signal CA_S may be outputted from an output node of the second latch 513.

If the address aligner 10 according to example embodiments is used, the operation speed of the memory device may be increased by aligning a plurality of addresses ADDRS in synchronization with the alignment clock signal that is generated based on a chip select signal CS.

Figure 10:
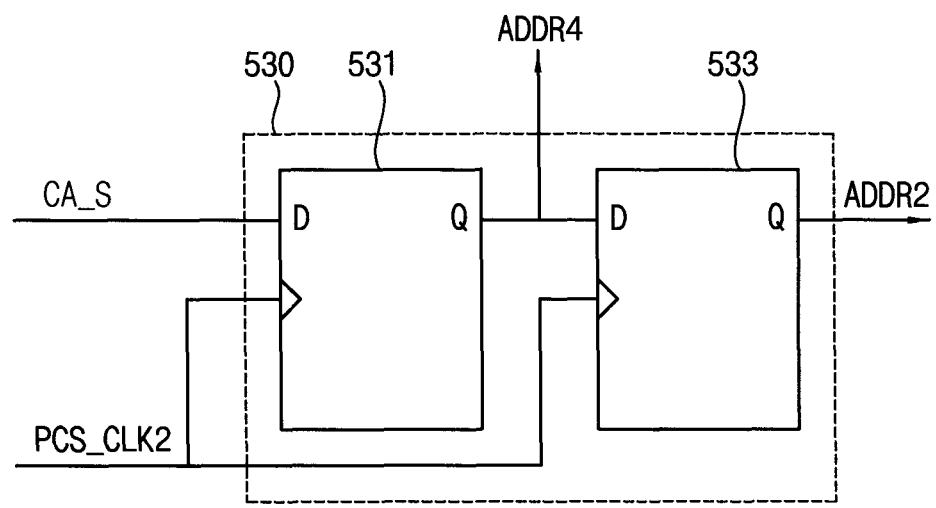
FIG. 10 is a diagram illustrating an example of a second alignment unit included in the alignment unit of FIG. 7.
Figure 11:
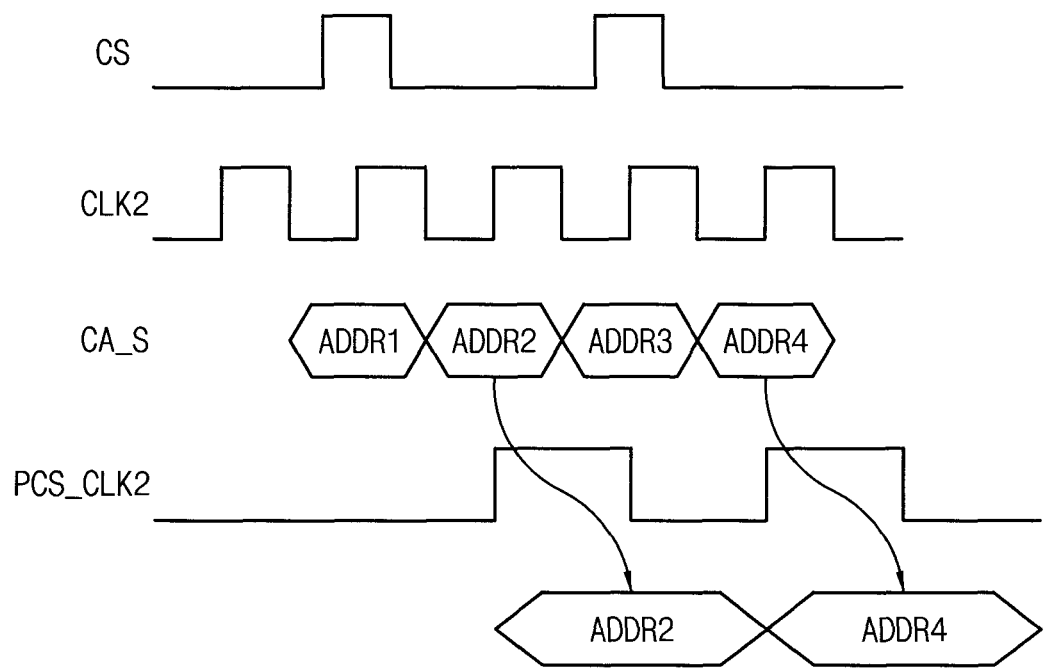
FIG. 11 is a timing diagram for describing an operation of the second alignment unit of FIG. 10.

FIG. 10 is a diagram illustrating an example of a second alignment unit included in the alignment unit of FIG. 7, and FIG. 11 is a timing diagram for describing an operation of the second alignment unit of FIG. 10.

Referring to FIGS. 10 and 11, the second alignment unit 530 may include the fourth latch 531 and the fifth latch 533 that are cascade-connected. For example, the sync command address signal CA_S may be applied to an input node of the fourth latch 531. The second alignment clock signal PCS_CLK2 may be applied to a clock node of the fourth latch 531. The even number addresses of the plurality of addresses ADDRS that are synchronized with the second alignment clock signal PCS_CLK2 may be outputted from the output node of the fourth latch 531.

For example, the sync command address signal CA_S may include the plurality of addresses ADDRS. The sync command address signal CA_S may include a first address ADDR1, a second address ADDR2, a third address ADDR3 and a fourth address ADDR4. The first address ADDR1, the second address ADDR2, the third address ADDR3 and the fourth address ADDR4 may be the plurality of addresses ADDRS. In this case, in a first rising edge of the second alignment clock signal PCS_CLK2, the second address ADDR2 may be outputted from the output node of the fourth latch 531 in synchronization with the second alignment clock signal PCS_CLK2. Next, in a second rising edge of the second alignment clock signal PCS_CLK2, the fourth address ADDR4 may be outputted from the output node of the fourth latch 531 in synchronization with the second alignment clock signal PCS_CLK2.

For example, the even number addresses among the plurality of addresses ADDRS may be inputted to the input node of the fifth latch 533. The even number addresses may be the output of the fourth latch 531. The second alignment clock signal PCS_CLK2 may be applied to a clock node of the fifth latch 533. In case the second address ADDR2 is outputted from the output node of the fifth latch 533 in synchronization with the second alignment clock signal PCS_CLK2, the fourth address ADDR4 may be outputted from the output node of the fourth latch 531 in synchronization with the second alignment clock signal PCS_CLK2. In this case, the second address ADDR2 and the fourth address ADDR4 that are outputted from the second alignment unit 530 may be aligned in synchronization with the second alignment clock signal PCS_CLK2. The second alignment unit 530 may output the even number addresses of the plurality of addresses ADDRS.

In an example embodiment, the second alignment clock signal PCS_CLK2 may be applied to a clock node of the fourth latch 531 and the fifth latch 533.

In an example embodiment, the sync command address signal CA_S may be provided to an input node of the fourth latch 531. A second address ADDR2 included in the sync command address signal CA_S may be outputted from an output node of the fifth latch 533. A fourth address ADDR4 included in the sync command address signal CA_S may be outputted from an output node of the fourth latch 531.

If the address aligner 10 according to example embodiments is used, the operation speed of the memory device may be increased by aligning a plurality of addresses ADDRS in synchronization with the alignment clock signal that is generated based on a chip select signal CS.

Figure 12:
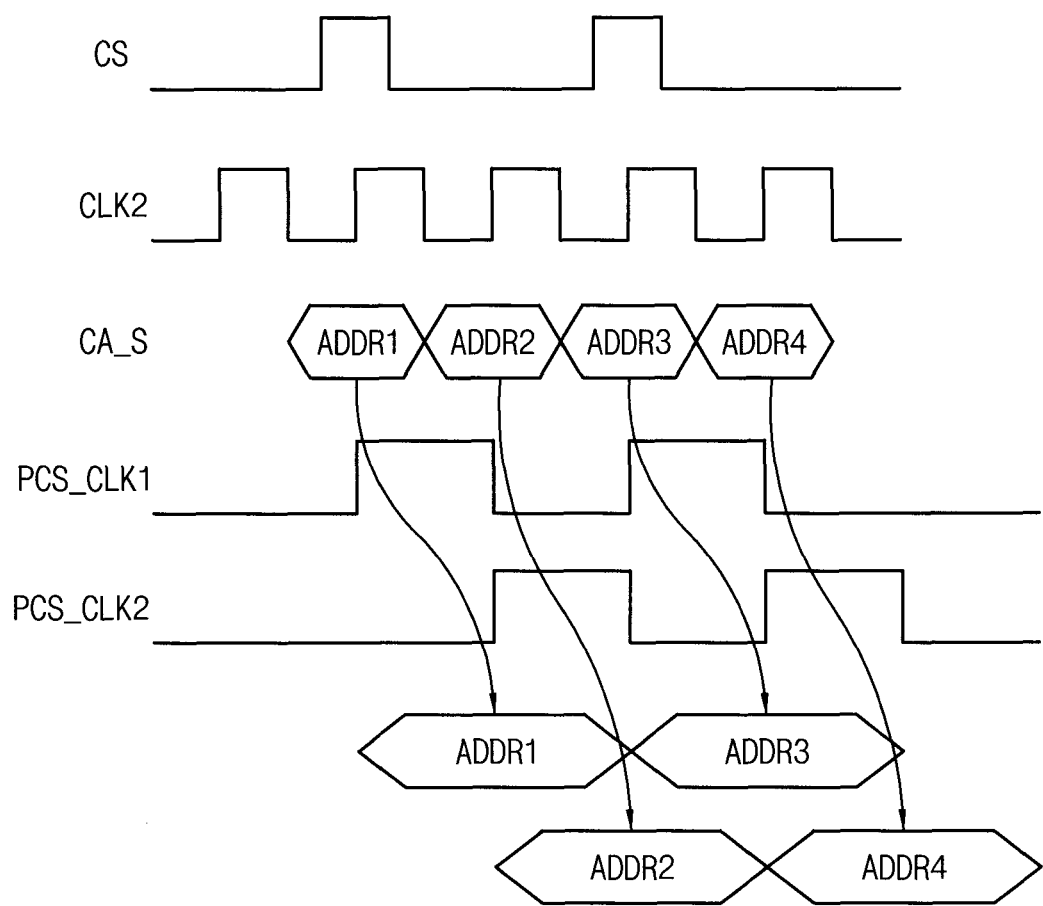
FIGS. 12 and 13 are timing diagrams for describing operations of the address aligner of FIG. 1.
Figure 13:
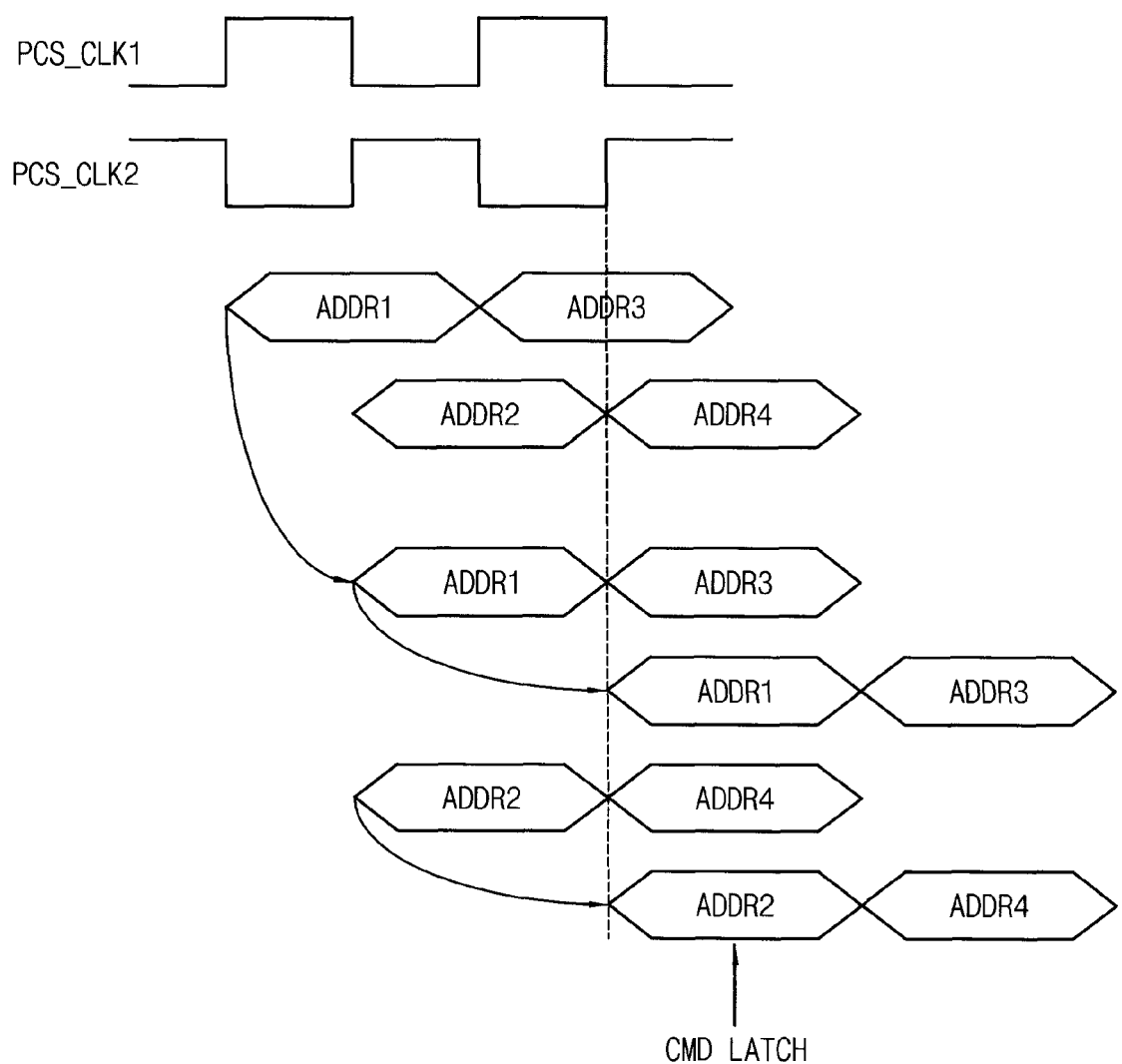

FIGS. 12 and 13 are timing diagrams for describing operations of the address aligner of FIG. 1.

Referring to FIGS. 1, 7 and 13, an address aligner 10 includes a command address providing unit 100, an alignment signal providing unit 300 and an alignment unit 500. The command address providing unit 100 outputs a sync command address signal CA_S by delaying a command address signal CA in synchronization with a first clock signal CLK1. The sync command address signal CA_S is synchronized with the first clock signal CLK1. The alignment signal providing unit 300 outputs alignment clock signals PCS_CLK by delaying a chip select signal CS in synchronization with a second clock signal CLK2. The alignment clock signals PCS_CLK are synchronized with the second clock signal CLK2. The alignment unit 500 outputs a plurality of addresses ADDRS in synchronization with the alignment clock signals PCS_CLK. The plurality of addresses ADDRS are included in the sync command address signal CA_S.

The alignment unit 500 may include a first alignment unit 510 and a second alignment unit 530. The first alignment unit 510 may output an odd number address included in the sync command address signal CA_S in synchronization with a first alignment clock signal PCS_CLK1 and a second alignment clock signal PCS_CLK2 among the alignment clock signals. The second alignment unit 530 may output an even number address included in the sync command address signal CA_S in synchronization with the second alignment clock signal PCS_CLK2 among the alignment clock signals.

For example, in case the first address ADDR1 is outputted from the output node of the third latch 515 in synchronization with the second alignment clock signal PCS_CLK2, the third address ADDR3 may be outputted from the output node of the second latch 513 in synchronization with the second alignment clock signal PCS_CLK2. In this case, the first address ADDR1 and the third address ADDR3 that are outputted from the first alignment unit 510 may be aligned in synchronization with the second alignment clock signal PCS_CLK2. In case the second address ADDR2 is outputted from the output node of the fifth latch 533 in synchronization with the second alignment clock signal PCS_CLK2, the fourth address ADDR4 may be outputted from the output node of the fourth latch 531 in synchronization with the second alignment clock signal PCS_CLK2. In this case, the second address ADDR2 and the fourth address ADDR4 that are outputted from the second alignment unit 530 may be aligned in synchronization with the second alignment clock signal PCS_CLK2. Therefore, the first address ADDR1, the second address ADDR2, the third address ADDR3 and the fourth address ADDR4 included in the plurality of addresses ADDRS may be aligned in synchronization with the second alignment clock signal PCS_CLK2.

If the address aligner 10 according to example embodiments is used, the operation speed of the memory device may be increased by aligning a plurality of addresses ADDRS in synchronization with the alignment clock signal that is generated based on a chip select signal CS.

Figure 14:
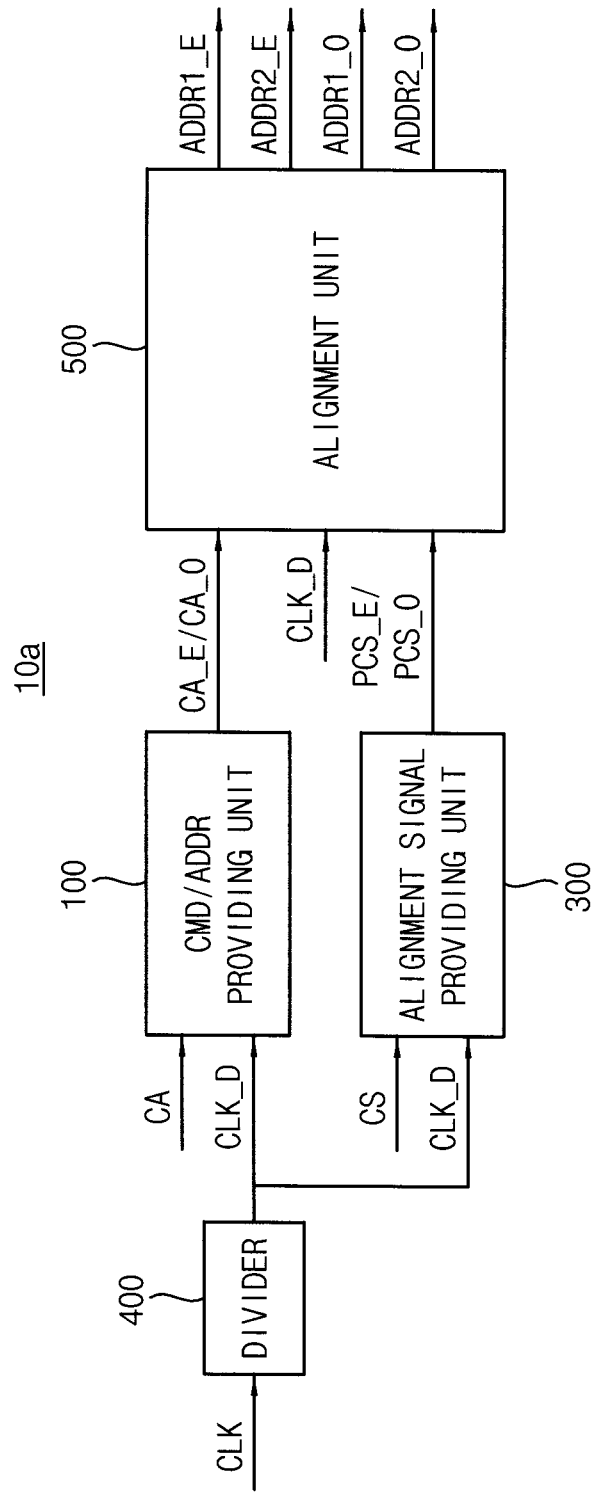
FIG. 14 is a block diagram illustrating an address aligner according to example embodiments.

FIG. 14 is a block diagram illustrating an address aligner according to example embodiments. Referring to FIG. 14, an address aligner 10*a* includes a command address providing unit 100, an alignment signal providing unit 300 and an alignment unit 500. The command address providing unit 100 outputs an odd command address signal CA_O and an even command address signal CA_E by delaying a command address signal CA in synchronization with a divided clock signal CLK_D. The odd command address signal CA_O and the even command address signal CA_E are synchronized with the divided clock signal CLK_D that is generated by dividing a clock signal CLK. The divider 400 may provide the divided clock signal CLK_D by dividing the clock signal CLK. For example, the command address signal CA and the divided clock signal CLK_D may be inputted to the command address providing unit 100. The odd command address signal CA_O and the even command address signal CA_E outputted from the command address providing unit 100 may be signals that are generated by delaying the command address signal CA in synchronization with the divided clock signal CLK_D. The odd command address signal CA_O and the even command address signal CA_E may be signals that are synchronized with the divided clock signal CLK_D.

The alignment signal providing unit 300 outputs an odd alignment signal PCS_O and an even alignment signal PCS_E by delaying a chip select signal CS in synchronization with the divided clock signal CLK_D. The odd alignment signal PCS_O and the even alignment signal PCS_E are synchronized with the divided clock signal CLK_D. For example, the chip select signal CS and the divided clock signal CLK_D may be inputted to the alignment signal providing unit 300. The odd alignment signal PCS_O and the even alignment signal PCS_E outputted from the alignment signal providing unit 300 may be signals that are synchronized with the divided clock signal CLK_D.

The alignment unit 500 outputs a plurality of addresses ADDRS included in the odd command address signal CA_O and the even command address signal CA_E based on the odd alignment signal PCS_O, the even alignment signal PCS_E and divided clock signal CLK_D. For example, the even command address signal CA_E, the odd command address signal CA_O, the even alignment signal PCS_E, the odd alignment signal PCS_O and the divided clock signal CLK_D may be inputted to the alignment unit 500. The plurality of addresses ADDRS including the even address and the odd address that are outputted from the alignment unit 500 may be signals that are synchronized with the divided clock signal CLK_D.

Figure 15:
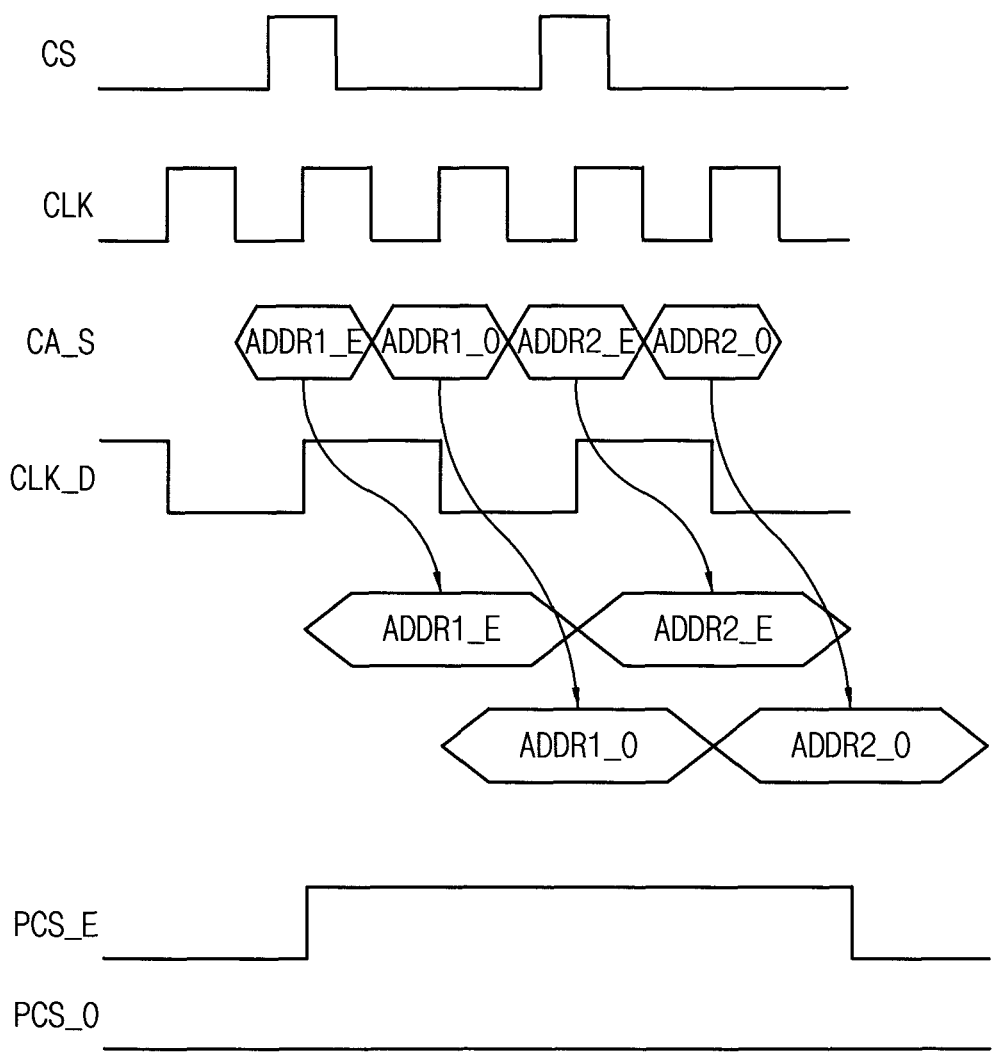
FIGS. 15 and 16 are timing diagrams for describing operations of the address aligner of FIG. 14.
Figure 16:
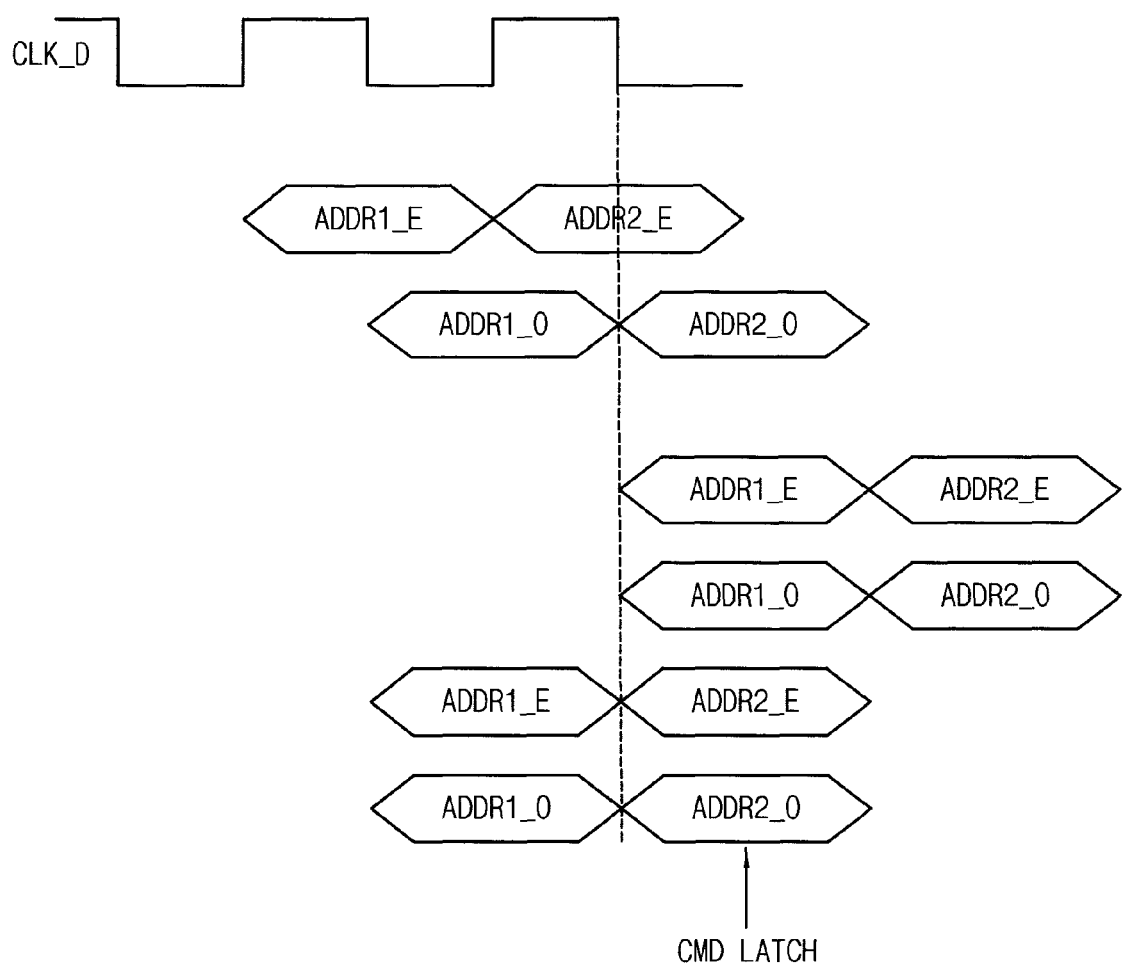

FIGS. 15 and 16 are timing diagrams for describing operations of the address aligner of FIG. 14.

Referring to FIGS. 15 and 16, the divided clock signal CLK_D may be a signal that is generated by dividing the clock signal CLK by two. The even alignment signal PCS_E may be generated using the chip select signal CS and the divided clock signal CLK_D. For example, The even alignment signal PCS_E may be a signal that is generated by delaying the chip select signal CS in synchronization with rising edge of the divided clock signal CLK_D. The odd alignment signal PCS_O may be a signal that is generated by delaying the chip select signal CS in synchronization with falling edge of the divided clock signal CLK_D. The address aligner 10 may align the plurality of addresses ADDRS based on the even alignment signal PCS_E and the odd alignment signal PCS_O. The command address signal CA may include the even command address signal CA_E and the odd command address signal CA_O. The command address signal CA may include the plurality of addresses ADDRS. The plurality of addresses ADDRS may include a first even address ADDR1_E, a second even address ADDR2_E, a first odd address ADDR1_O and a second odd address ADDR2_O. The even command address signal may include the first even address ADDR1_E and the second even address ADDR2_E. The odd command address signal may include the first odd address ADDR1_O and the second odd address ADDR2_O. For example, while the even address alignment signal is logic high, the address aligner 10 may align the first even address ADDR1_E, the second even address ADDR2_E, the first odd address ADDR1_O and the second odd address ADDR2_O in synchronization with the divided clock signal CLK_D.

If the address aligner 10 according to example embodiments is used, the operation speed of the memory device may be increased by aligning a plurality of addresses ADDRS according to the even alignment signal PCS_E that is generated based on a chip select signal CS. In addition, the operation speed of the memory device may be increased by aligning the plurality of addresses ADDRS according to the odd alignment signal PCS_O that is generated based on the chip select signal CS.

Figure 17:
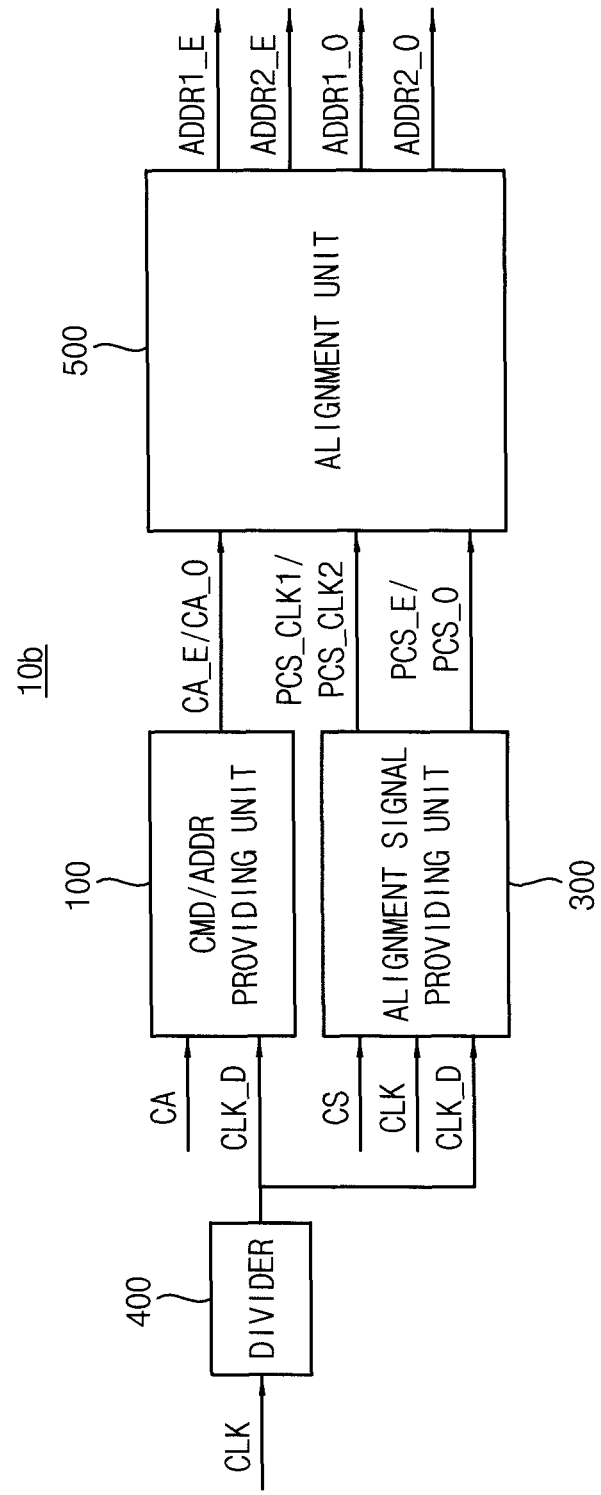
FIG. 17 is a block diagram illustrating an address aligner according to an example embodiment.
Figure 18:
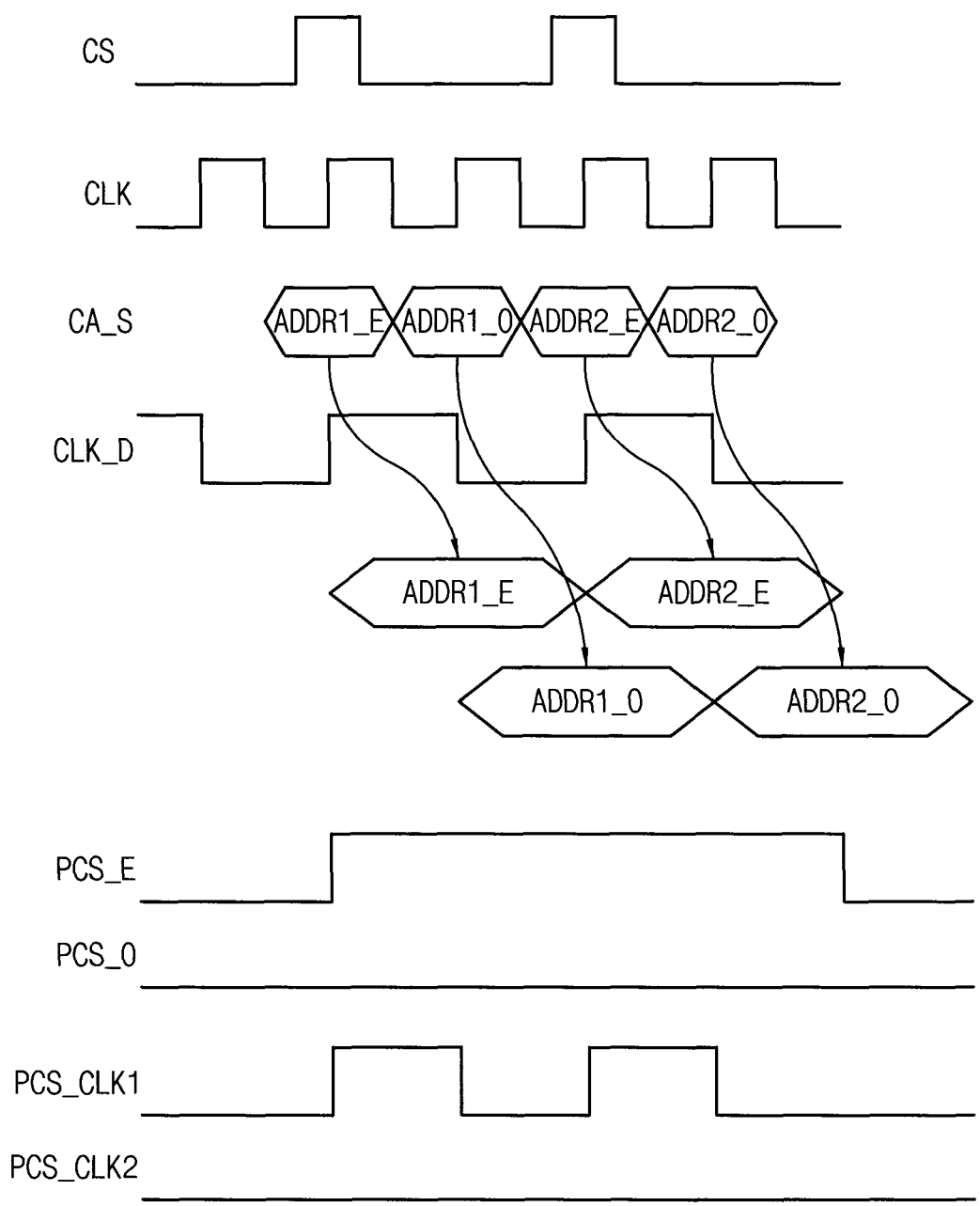
FIG. 18 is a timing diagram for describing an operation of the address aligner of FIG. 17.

FIG. 17 is a block diagram illustrating an address aligner according to an example embodiment, and FIG. 18 is a timing diagram for describing an operation of the address aligner of FIG. 17.

Referring to FIGS. 17 and 18, an address aligner 10b includes a command address providing unit 100, an alignment signal providing unit 300 and an alignment unit 500. The command address providing unit 100 outputs an odd command address signal CA_O and an even command address signal CA_E by delaying a command address signal CA in synchronization with a divided clock signal CLK_D. The odd command address signal CA_O and the even command address signal CA_E are synchronized with the divided clock signal CLK_D that is generated by dividing a clock signal. The divider 400 may provide the divided clock signal CLK_D by dividing the clock signal CLK.

The alignment signal providing unit 300 outputs an odd alignment signal PCS_O and an even alignment signal PCS_E by delaying a chip select signal CS in synchronization with the divided clock signal CLK_D. The odd alignment signal PCS_O and the even alignment signal PCS_E are synchronized with the divided clock signal CLK_D. The alignment signal providing unit 300 may provide the first alignment clock signal PCS_CLK1 and the second alignment clock signal PCS_CLK2 based on the chip select signal CS and the clock signal CLK.

The alignment unit 500 outputs a plurality of addresses ADDRS included in the odd command address signal CA_O and the even command address signal CA_E based on the odd alignment signal PCS_O, the even alignment signal PCS_E, the first alignment clock signal PCS_CLK1 and the second alignment clock signal PCS_CLK2. For example, the even command address signal CA_E, the odd command address signal CA_O, the even alignment signal PCS_E, the odd alignment signal PCS_O, a first alignment clock signal PCS_CLK1 and the second alignment clock signal PCS_CLK2 may be inputted to the alignment unit 500. The plurality of addresses ADDRS including the even address and the odd address that are outputted from the alignment unit 500 may be signals that are synchronized with the first alignment clock signal PCS_CLK1 or the second alignment clock signal PCS_CLK2. For example, the even alignment signal PCS_E may be a signal that is generated by delaying the chip select signal CS in synchronization with the rising edge of the divided clock signal CLK_D. The odd alignment signal PCS_O may be a signal that is generated by delaying the chip select signal CS in synchronization with the falling edge of the divided clock signal CLK_D. The first alignment clock signal PCS_CLK1 may be a signal that is generated by delaying the chip select signal CS in synchronization with rising edge of the clock signal. The second alignment clock signal PCS_CLK2 may be a signal that is generated by delaying the chip select signal CS in synchronization with falling edge of the clock signal CLK.

The address aligner 10b according to example embodiments may align the plurality of addresses ADDRS based on the odd alignment signal PCS_O, the even alignment signal PCS_E, the first alignment clock signal PCS_CLK1 and the second alignment clock signal PCS_CLK2. The command address signal CA may include the even command address signal CA_E and the odd command address signal CA_O. The command address signal CA may include the plurality of addresses ADDRS. The plurality of addresses ADDRS may include a first even address ADDR1_E, a second even address ADDR2_E, a first odd address ADDR1_O and a second odd address ADDR2_O. The even command address signal may include the first even address ADDR1_E and the second even address ADDR2_E. The odd command address signal may include the first odd address ADDR1_O and the second odd address ADDR2_O. For example, while the even address alignment signal is logic high based on the first alignment signal, the address aligner 10b may align the first even address ADDR1_E, the second even address ADDR2_E, the first odd address ADDR1_O and the second odd address ADDR2_O in synchronization with the first alignment clock signal PCS_CLK1.

If the address aligner 10b according to example embodiments is used, the operation speed of the memory device may be increased by aligning a plurality of addresses ADDRS in synchronization with the alignment clock signal that is generated based on a chip select signal CS.

Figure 19:
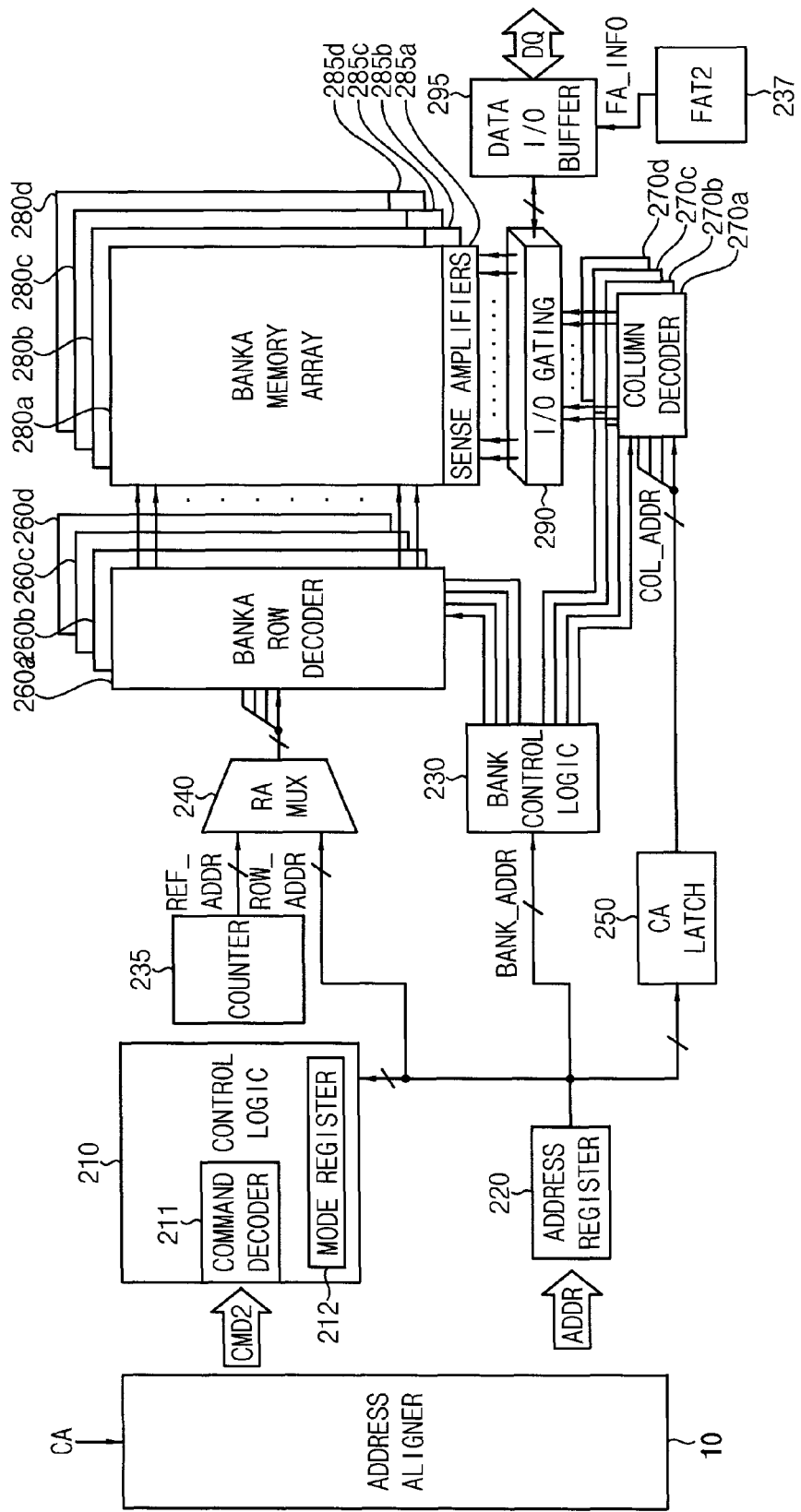
FIG. 19 is a block diagram illustrating a memory device according to example embodiments.

FIG. 19 is a block diagram illustrating a memory device according to example embodiments. Referring to FIG. 19, the memory device 201 includes a control logic 210, an address register 220, a bank control logic 230, a row address multiplexer 240, a second fail address table 237, a refresh counter 235, a column address latch 250, a row decoder 260, a column decoder 270, a memory cell array 280, a sense amplifier unit 285, an input/output gating circuit 290 and a data input/output buffer 295. In some embodiments, the memory device 201 may be a dynamic random access memory (DRAM), such as a double data rate synchronous dynamic random access memory (DDR SDRAM), a low power double data rate synchronous dynamic random access memory (LPDDR SDRAM), a graphics double data rate synchronous dynamic random access memory (GDDR SDRAM), a Rambus dynamic random access memory (RDRAM), etc.

The memory cell array may include first through fourth bank arrays 280a, 280b, 280c and 280d. The row decoder may include first through fourth bank row decoders 260a, 260b, 260c and 260d respectively coupled to the first through fourth bank arrays 280a, 280b, 280c and 280d, the column decoder may include first through fourth bank column decoders 270a, 270b, 270c and 270d respectively coupled to the first through fourth bank arrays 280a, 280b, 280c and 280d, and the sense amplifier unit may include first through fourth bank sense amplifiers 285a, 285b, 285c and 285d respectively coupled to the first through fourth bank arrays 280a, 280b, 280c and 280d. The first through fourth bank arrays 280a, 280b, 280c and 280d, the first through fourth bank row decoders 260a, 260b, 260c and 260d, the first through fourth bank column decoders 270a, 270b, 270c and 270d and the first through fourth bank sense amplifiers 285a, 285b, 285c and 285d may form first through fourth banks Although the volatile memory device 201 is illustrated in FIG. 19 as including four banks, the volatile memory device 201 may include any number of banks.

The address register 220 may receive an address ADDR including a bank address BANK_ADDR, a row address ROW_ADDR and a column address COL_ADDR from a memory controller (not illustrated). The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through fourth bank row decoders 260a, 260b, 260c and 260d corresponding to the bank address BANK_ADDR may be activated in response to the bank control signals, and one of the first through fourth bank column decoders 270a, 270b, 270c and 270d corresponding to the bank address BANK_ADDR may be activated in response to the bank control signals.

The row address multiplexer 240 may receive the row address ROW_ADDR from the address register 220, and may receive a refresh row address REF_ADDR from the refresh counter 235. The row address multiplexer 240 may selectively output the row address ROW_ADDR or the refresh row address CREF_ADDR. A row address output from the row address multiplexer 240 may be applied to the first through fourth bank row decoders 260a, 260b, 260c and 260d.

The activated one of the first through fourth bank row decoders 260a, 260b, 260c and 260d may decode the row address output from the row address multiplexer 240, and may activate a word line corresponding to the row address. For example, the activated bank row decoder may apply a word line driving voltage to the word line corresponding to the row address.

The column address latch 250 may receive the column address COL_ADDR from the address register 220, and may temporarily store the received column address COL_ADDR. In some embodiments, in a burst mode, the column address latch 250 may generate column addresses that increment from the received column address COL_ADDR. The column address latch 250 may apply the temporarily stored or generated column address to the first through fourth bank column decoders 270a, 270b, 270c and 270d.

The activated one of the first through fourth bank column decoders 270a, 270b, 270c and 270d may decode the column address COL_ADDR output from the column address latch 250, and may control the input/output gating circuit 290 to output data corresponding to the column address COL_ADDR.

The input/output gating circuit 290 may include circuitry for gating input/output data. The input/output gating circuit 290 may further include an input data mask logic, read data latches for storing data output from the first through fourth bank arrays 280a, 280b, 280c and 280d, and write drivers for writing data to the first through fourth bank arrays 280a, 280b, 280c and 280d.

Data DQ to be read from one bank array of the first through fourth bank arrays 280a, 280b, 280c and 280d may be sensed by a sense amplifier coupled to the one bank array, and may be stored in the read data latches. The data DQ stored in the read data latches may be provided to the memory controller via the data input/output buffer 295. Data DQ to be written to one bank array of the first through fourth bank arrays 280a, 280b, 280c and 280d may be provided from the memory controller to the data input/output buffer 295. The data DQ provided to the data input/output buffer 295 may be written to the one array bank via the write drivers.

The control logic 210 may control operations of the memory device 201. For example, the control logic 210 may generate control signals for the memory device 201 to perform a write operation or a read operation. The control logic 210 may include a command decoder 211 that decodes a command CMD received from the memory controller and a mode register 212 that sets an operation mode of the memory device 201. For example, the command decoder 211 may generate the control signals corresponding to the command CMD by decoding a write enable signal (/WE), a row address strobe signal (/RAS), a column address strobe signal (/CAS), a chip select signal (/CS), etc. The command decoder 211 may further receive a clock signal (CLK) and a clock enable signal (/CKE) for operating the memory device 201 in a synchronous manner.

If the address aligner 10 according to example embodiments is used, the operation speed of the memory device may be increased by aligning a plurality of addresses ADDRS in synchronization with the alignment clock signal that is generated based on a chip select signal.

Figure 20:
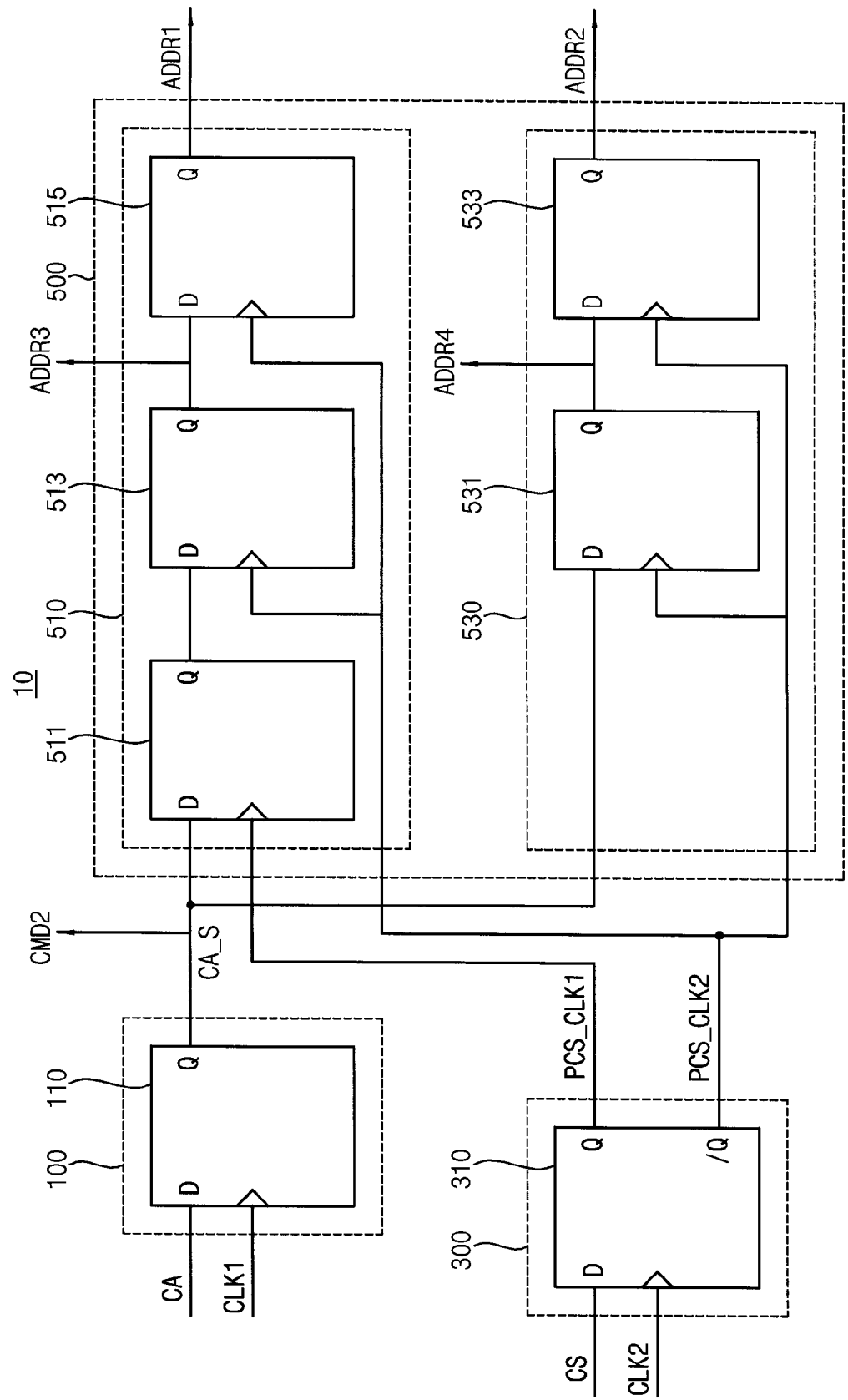
FIG. 20 is a diagram illustrating an example of an address aligner included in the memory device of FIG. 19.

FIG. 20 is a diagram illustrating an example of an address aligner 10 included in the memory device of FIG. 19.

Referring to FIGS. 19 and 20, the command address providing unit 100 may include a command address latch 110. The command address signal CA may be provided to an input node of the command address latch 110. The first clock signal CLK1 may be provided to a clock node of the command address latch 110. The sync command address signal CA_S may be outputted in synchronization with the first clock signal CLK1 through an output node of the command address latch 110. The alignment signal providing unit 300 may include a chip select latch 310. The chip select signal CS may be provided to an input node of the chip select latch 310. The second clock signal CLK2 may be provided to a clock node of the chip select latch 310. A first alignment clock signal PCS_CLK1 of the alignment clock signals PCS_CLK may be outputted through an output node of the chip select latch 310.

The alignment unit 500 may include a first alignment unit 510 and a second alignment unit 530. The first alignment unit 510 may output an odd number address included in the sync command address signal CA_S in synchronization with a first alignment clock signal PCS_CLK1 and a second alignment clock signal PCS_CLK2 among the alignment clock signal. The second alignment unit 530 may output an even number address included in the sync command address signal CA_S in synchronization with the second alignment clock signal PCS_CLK2 among the alignment clock signal.

In an example embodiment, the plurality of addresses ADDRS may be row addresses of a memory device. For example, the plurality of addresses ADDRS may include the first address ADDR1, the second address ADDR2, the third address ADDR3 and the fourth address ADDR4. A combination of the first address ADDR1, the second address ADDR2, the third address ADDR3 and the fourth address ADDR4 may be the row address of the memory device.

In an example embodiment, the plurality of addresses ADDRS may be column addresses of a memory device. For example, the plurality of addresses ADDRS may include the first address ADDR1, the second address ADDR2, the third address ADDR3 and the fourth address ADDR4. A combination of the first address ADDR1, the second address ADDR2, the third address ADDR3 and the fourth address ADDR4 may be the column address of the memory device.

In an example embodiment, the first clock signal CLK1 may be equal to the second clock signal CLK2.

In an example embodiment, the frequency of the first clock signal CLK1 is greater than the frequency of the alignment clock signals PCS_CLK. For example, the frequency of the first clock signal CLK1 may be twice the frequency of the alignment clock signals PCS_CLK.

The command CMD2 included in the sync command address signal CA_S may be transferred to the control logic 210 through the output node of the command address providing unit 100.

Figure 21:
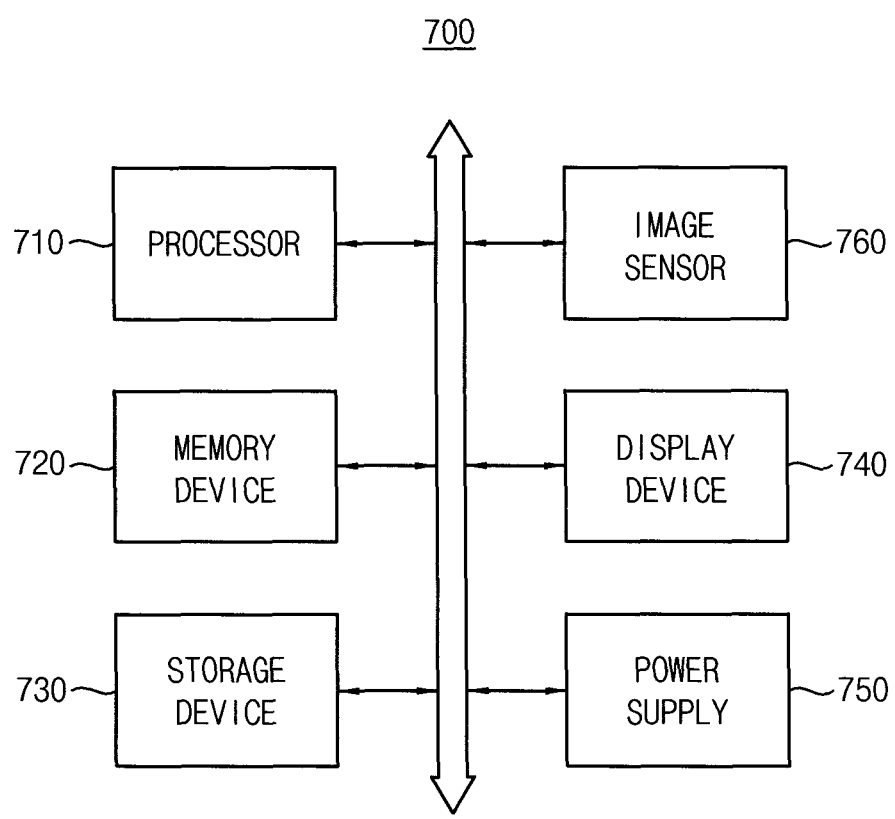
FIG. 21 is a block diagram illustrating a mobile device including the memory device according to example embodiments.

FIG. 21 is a block diagram illustrating a mobile device including the memory device according to example embodiments. Referring to FIG. 21, a mobile device 700 may include a processor 710, a memory device 720, a storage device 730, a display device 740, a power supply 750 and an image sensor 760. The mobile device 700 may further include ports that communicate with a video card, a sound card, a memory card, a USB device, other electronic devices, etc.

The processor 710 may perform various calculations or tasks. According to embodiments, the processor 710 may be a microprocessor or a CPU. The processor 710 may communicate with the memory device 720, the storage device 730, and the display device 740 via an address bus, a control bus, and/or a data bus. In some embodiments, the processor 710 may be coupled to an extended bus, such as a peripheral component interconnection (PCI) bus. The memory device 720 may store data for operating the mobile device 700. For example, the memory device 720 may be implemented with a dynamic random access memory (DRAM) device, a mobile DRAM device, a static random access memory (SRAM) device, a phase-change random access memory (PRAM) device, a ferroelectric random access memory (FRAM) device, a resistive random access memory (RRAM) device, and/or a magnetic random access memory (MRAM) device. The memory device 720 includes the data loading circuit according to example embodiments. The storage device 730 may include a solid state drive (SSD), a hard disk drive (HDD), a CD-ROM, etc. The mobile device 700 may further include an input device such as a touchscreen, a keyboard, a keypad, a mouse, etc., and an output device such as a printer, a display device, etc. The power supply 750 supplies operation voltages for the mobile device 700.

The image sensor 760 may communicate with the processor 710 via the buses or other communication links. The image sensor 760 may be integrated with the processor 710 in one chip, or the image sensor 760 and the processor 710 may be implemented as separate chips.

At least a portion of the mobile device 700 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP). The mobile device 700 may be a digital camera, a mobile phone, a smart phone, a portable multimedia player (PMP), a personal digital assistant (PDA), a computer, etc.

In addition, in an embodiment of the present disclosure, a three dimensional (3D) memory array is provided in the memory device 720. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. The following patent documents, which are hereby incorporated by reference, describe suitable configurations for the 3D memory arrays, in which the three-dimensional memory array is configured as a plurality of levels, with word-lines and/or bit-lines shared between levels: U.S. Pat. Nos. 7,679,133; 8,553,466; 8,654,587; 8,559,235; and US Pat. Pub. No. 2011/0233648.

Figure 22:
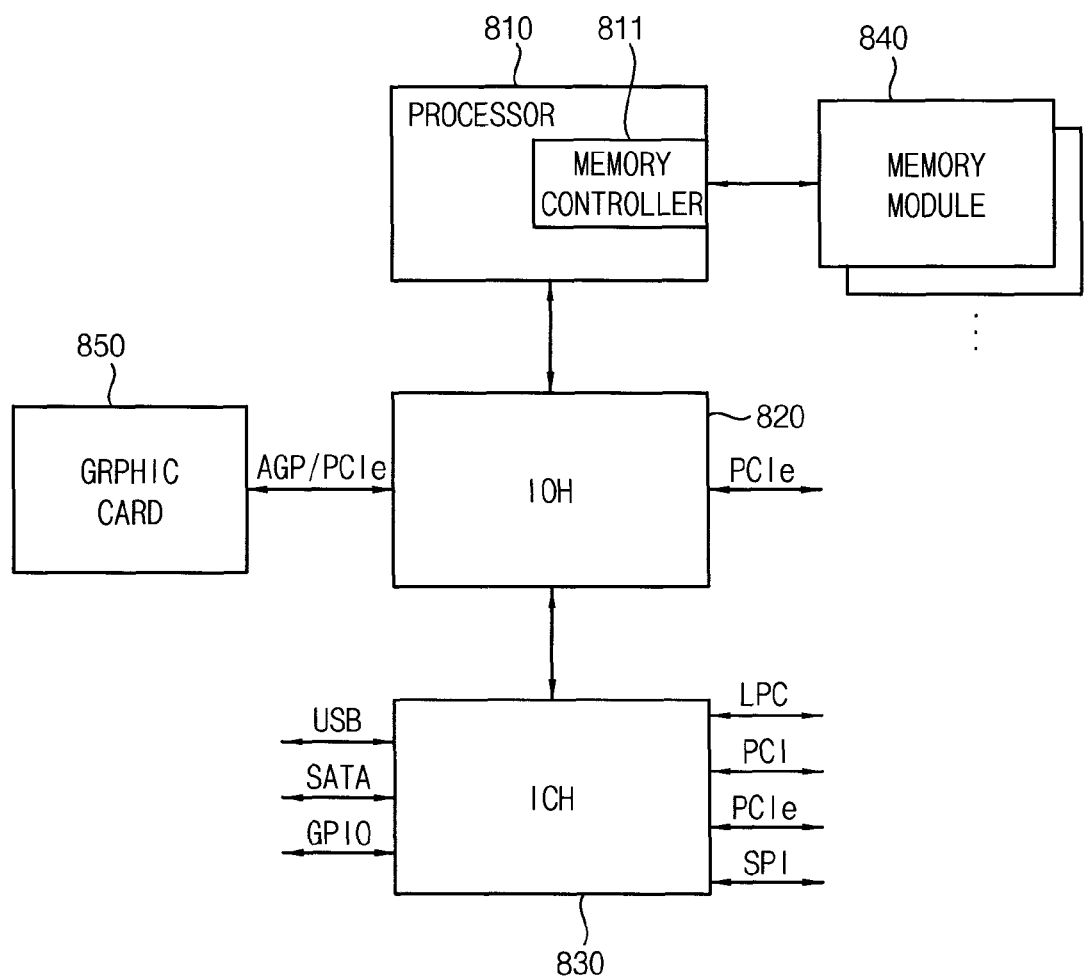
FIG. 22 is a block diagram illustrating a computing system including the memory device according to example embodiments.

FIG. 22 is a block diagram illustrating a computing system including the memory device according to example embodiments. Referring to FIG. 22, a computing system 800 includes a processor 810, an input/output hub (IOH) 820, an input/output controller hub (ICH) 830, at least one memory module 840 and a graphics card 850. In some embodiments, the computing system 800 may be a personal computer (PC), a server computer, a workstation, a laptop computer, a mobile phone, a smart phone, a personal digital assistant (PDA), a portable multimedia player (PMP), a digital camera), a digital television, a set-top box, a music player, a portable game console, a navigation system, etc.

The processor 810 may perform various computing functions, such as executing specific software for performing specific calculations or tasks. For example, the processor 810 may be a microprocessor, a central process unit (CPU), a digital signal processor, or the like. In some embodiments, the processor 810 may include a single core or multiple cores. For example, the processor 810 may be a multi-core processor, such as a dual-core processor, a quad-core processor, a hexa-core processor, etc. In some embodiments, the computing system 800 may include a plurality of processors. The processor 810 may include an internal or external cache memory.

The processor 810 may include a memory controller 811 for controlling operations of the memory module 840. The memory controller 811 included in the processor 810 may be referred to as an integrated memory controller (IMC). A memory interface between the memory controller 811 and the memory module 840 may be implemented with a single channel including a plurality of signal lines, or may bay be implemented with multiple channels, to each of which at least one memory module 840 may be coupled. In some embodiments, the memory controller 811 may be located inside the input/output hub 820, which may be referred to as memory controller hub (MCH).

The input/output hub 820 may manage data transfer between processor 810 and devices, such as the graphics card 850. The input/output hub 820 may be coupled to the processor 810 via various interfaces. For example, the interface between the processor 810 and the input/output hub 820 may be a front side bus (FSB), a system bus, a HyperTransport, a lightning data transport (LDT), a Quick-Path interconnect (QPI), a common system interface (CSI), etc. In some embodiments, the computing system 800 may include a plurality of input/output hubs. The input/output hub 820 may provide various interfaces with the devices. For example, the input/output hub 820 may provide an accelerated graphics port (AGP) interface, a peripheral component interface-express (PCIe), a communications streaming architecture (CSA) interface, etc.

The graphics card 850 may be coupled to the input/output hub 820 via AGP or PCIe. The graphics card 850 may control a display device (not shown) for displaying an image. The graphics card 850 may include an internal processor for processing image data and an internal memory device. In some embodiments, the input/output hub 820 may include an internal graphics device along with or instead of the graphics card 850 outside the graphics card 850. The graphics device included in the input/output hub 820 may be referred to as integrated graphics. Further, the input/output hub 820 including the internal memory controller and the internal graphics device may be referred to as a graphics and memory controller hub (GMCH).

The input/output controller hub 830 may perform data buffering and interface arbitration to efficiently operate various system interfaces. The input/output controller hub 830 may be coupled to the input/output hub 820 via an internal bus, such as a direct media interface (DMI), a hub interface, an enterprise Southbridge interface (ESI), PCIe, etc. The input/output controller hub 830 may provide various interfaces with peripheral devices. For example, the input/output controller hub 830 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 810, the input/output hub 820 and the input/output controller hub 830 may be implemented as separate chipsets or separate integrated circuits. In other embodiments, various combinations of the processor 810, the input/output hub 820 and the input/output controller hub 830 may be implemented as a single chipset.

The present inventive concept may be applied to systems such as be a mobile phone, a smart phone, a personal digital assistant (PDA), a portable multimedia player (PMP), a digital camera, a music player, a portable game console, a navigation system, etc. The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims.

What is claimed is:

1. An address aligner comprising:
a command address providing unit configured to output a sync command address signal by delaying a command address signal in synchronization with a first clock signal, the sync command address signal being synchronized with the first clock signal;
an alignment signal providing unit configured to output alignment clock signals by delaying a chip select signal in synchronization with a second clock signal, the alignment clock signals being synchronized with the second clock signal; and
an alignment unit configured to output a plurality of addresses in synchronization with the alignment clock signals, the plurality of addresses being included in the sync command address signal.

2. The address aligner of claim 1, wherein the command address providing unit includes a command address latch configured to receive the command address signal on an input node, configured to receive the first clock signal on a clock node, and configured to output the sync command address signal in synchronization with the first clock signal through an output node.

3. The address aligner of claim 1, wherein the alignment signal providing unit includes a chip select latch configured to receive the chip select signal on an input node, configured to receive the second clock signal on a clock node, and configured to output a first alignment clock signal of the alignment clock signals through an output node.

4. The address aligner of claim 3, wherein the chip select latch is configured to output a second alignment clock signal of the alignment clock signals through an inversion output node.

5. The address aligner of claim 4, wherein the first alignment clock signal and the second alignment clock signal are output in synchronization with the second clock signal.

6. The address aligner of claim 1, wherein the first clock signal is equal to the second clock signal.

7. The address aligner of claim 1, wherein the alignment unit includes:
a first alignment unit configured to output an odd number address included in the sync command address signal in synchronization with a first alignment clock signal and a second alignment clock signal among the alignment clock signals; and
a second alignment unit configured to output an even number address included in the sync command address signal in synchronization with the second alignment clock signal among the alignment clock signals.

8. The address aligner of claim 7, wherein the first alignment unit includes a first latch, a second latch and a third latch that are cascade-connected; and wherein the first latch is configured to receive the first alignment clock signal on a clock node, the second latch and the third latch are configured to receive the second alignment clock signal on a respective clock node thereof.

9. The address aligner of claim 8, wherein the first latch is configured to receive the sync command address signal on an input node; wherein the third latch is configured to output a first address included in the sync command address signal at an output node; and wherein the second latch is configured to output a third address included in the sync command address signal at an output node.

10. The address aligner of claim 7, wherein the second alignment unit includes a fourth latch and a fifth latch that are cascade-connected; and wherein the fourth latch and the fifth latch are configured to receive the second alignment clock signal at a respective clock node.

11. The address aligner of claim 10, wherein the fourth latch is configured to receive the sync command address signal at an input node; wherein the fifth latch is configured to output a second address included in the sync command address signal at an output node; and wherein the fourth latch is configured to output a fourth address included in the sync command address signal at an output node.

12. The address aligner of claim 1, wherein the plurality of addresses are row addresses of a memory device.

13. The address aligner of claim 1, wherein the plurality of addresses are column addresses of a memory device.

14. The address aligner of claim 13, wherein the memory device includes a three-dimensional memory array in which at least one of word-lines and bit-lines are shared between levels.

15. A method of aligning addresses comprising:
generating a sync command address signal with a command address providing unit by delaying a command address signal in synchronization with a first clock signal, the sync command address signal being synchronized with the first clock signal;
generating alignment clock signals with an alignment signal providing unit by delaying a chip select signal in synchronization with a second clock signal, the alignment clock signals being synchronized with the second clock signal; and
generating a plurality of addresses in synchronization with the alignment clock signals with an alignment unit, the plurality of addresses being included in the sync command address signal.

16. The method of claim 15, wherein the command address providing unit includes a command address latch receiving the command address signal on an input node, receiving the first clock signal on a clock node, and outputting the sync command address signal in synchronization with the first clock signal through an output node.

17. The method of claim 15, wherein the alignment signal providing unit includes a chip select latch receiving the chip select signal on an input node, receiving the second clock signal on a clock node, and outputting a first alignment clock signal of the alignment clock signals through an output node.

18. The method of claim 15, wherein the alignment unit includes:
a first alignment unit outputting an odd number address included in the sync command address signal in synchronization with a first alignment clock signal and a second alignment clock signal among the alignment clock signals; and
a second alignment unit outputting an even number address included in the sync command address signal in synchronization with the second alignment clock signal among the alignment clock signals.

* * * * *